US008076983B2

United States Patent
Ito

(10) Patent No.: US 8,076,983 B2
(45) Date of Patent: Dec. 13, 2011

(54) CONSTANT-TEMPERATURE TYPE CRYSTAL OSCILLATOR

(75) Inventor: Manabu Ito, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 108 days.

(21) Appl. No.: 12/586,028

(22) Filed: Sep. 16, 2009

(65) Prior Publication Data

US 2010/0073098 A1    Mar. 25, 2010

(30) Foreign Application Priority Data

Sep. 24, 2008    (JP) ................. 2008-244373

(51) Int. Cl.
    *H03B 5/32*    (2006.01)
(52) U.S. Cl. .............. 331/158; 331/176; 331/116 R; 331/116 FE; 331/68
(58) Field of Classification Search ............. 331/68, 331/176, 158, 116 R, 116 FE
    See application file for complete search history.

(56) References Cited

U.S. PATENT DOCUMENTS 7,479,835 B2    1/2009    Mitome et al.

FOREIGN PATENT DOCUMENTS

| JP | 2005-175703 A | 6/2005 |
|----|---------------|--------|
| JP | 2005-341191   | 12/2005 |
| JP | 2006-311496   | 11/2006 |
| JP | 2007-110698 A | 4/2007 |
| JP | 2007-201858 A | 8/2007 |

*Primary Examiner* — Arnold Kinkead
(74) *Attorney, Agent, or Firm* — Carrier Blackman & Associates, P.C.; Joseph P. Carrier; William D. Blackman

(57) ABSTRACT

A constant-temperature type crystal oscillator includes: a crystal unit including a case main body, in which two crystal terminals and two dummy terminals are provided on an outer bottom face thereof, and a crystal element housed in the case main body; an oscillator output circuit including an oscillating stage and a buffering stage; a temperature control circuit for keeping an operational temperature of the crystal unit; and a circuit substrate, on which circuit elements of the crystal unit, the oscillator output circuit and the temperature control circuit are installed. The temperature control circuit includes: heating chip resistors; a power transistor; and a temperature sensing element. Each of the dummy terminals is connected to a respective one of circuit terminals on the circuit substrate. At least one of the circuit terminals is connected to an electrically-conducting path, to which one terminal of the heating chip resistors is electrically connected, on the circuit substrate.

11 Claims, 9 Drawing Sheets

CONSTANT-TEMPERATURE TYPE CRYSTAL OSCILLATOR

This application claims priority from Japanese Patent Application No. 2008-244373 filed on Sep. 24, 2008, the entire subject matter of which is incorporated herein by reference.

BACKGROUND OF THE INVENTION

1. Field of the Invention

The invention relates to a technical field of a constant-temperature type crystal oscillator (hereinafter referred to as constant-temperature type oscillator) using a crystal unit for surface mounting, and in particular, to a constant-temperature type oscillator in which the efficiency of heat conduction from heating chip resistors (hereinafter referred to as heating resistors) is enhanced.

2. Description of the Related Art

Constant-temperature type oscillators keep the operational temperatures of their crystal units constant. Thus, even when an ambient temperature is changed, the frequency stability can be improved. Therefore, the constant-temperature type oscillators are applied to wireless devices in communication facilities which are, for example, base stations. In recent years, in place of a traditional constant-temperature bath, on which heating coils are wound, heating resistors are used as a heat source so as to simplify a constant-temperature structure. Then, there is a constant-temperature type oscillator in which a crystal unit is formed for surface mounting, which is reduced in height size (see, for example, JP-A-2006-311496 and JP-A-2005-341191).

FIGS. 6A to 8 are diagrams for explanation of one example of a related art constant-temperature type oscillator. FIG. 6A is a cross-sectional view of the related art constant-temperature type oscillator, and FIG. 6B is a circuit diagram thereof. FIG. 7A is a cross-sectional view of a crystal unit thereof, FIG. 7B is a bottom view thereof, and FIG. 7C is a frequency-temperature characteristic diagram thereof. FIG. 8 is a bottom view of a circuit substrate thereof.

The constant-temperature type oscillator has a crystal unit 1 for surface mounting, respective circuit elements 4 forming an oscillator output circuit 2 and a temperature control circuit 3, and a circuit substrate 5 on which the circuit elements 4 including the crystal unit 1 are installed thereon (see FIGS. 6A to 6C). Then, the constant-temperature type oscillator is configured such that the circuit substrate 5 is held with lead wires 8 of a metal base 7 which is made airtight with glass 6, and these are covered with a metal cover 9 by resistance welding or the like.

With respect to the crystal unit 1, a crystal element 1A is housed in a case main body 10 which is formed to be concave, for example, and its opening end face is sealed up with a metal cover 11, for example, to hermetically encapsulate the crystal element 1A having an excitation electrode (not shown) and leading electrode (not shown) on both principal surfaces (see FIGS. 7A to 7C). The case main body 10 is made of laminar ceramic, for example, and has crystal terminals 12a electrically connected to the leading electrode of the crystal element 1A on a set of diagonal corners of the outer bottom face, for example, and has dummy terminals 12b on the other set of diagonal corners. The dummy terminals 12b are electrically connected to the metal cover via an electrically-conducting path including through electrodes 14 and the like, for example, and are connected to the ground potential.

The crystal element 1A is formed as, for example, an SC-cut crystal element or an AT-cut crystal element, and has the frequency-temperature characteristic that approximately 80° C. at the higher temperature side higher than or equal to 25° C. as room temperature is an extreme value, and the oscillating frequency varies according to a temperature in any cases of both of the SC-cut and AT-cut crystal elements. For example, in an AT-cut crystal element, the frequency-temperature characteristic shows a cubic curve (curve A in FIG. 7C), and in an SC-cut crystal element, the frequency-temperature characteristic shows a quadratic curve (curve B in FIG. 7C). Incidentally, frequency deviation $\Delta f/f$ is plotted along the ordinate of the diagram, where f is a frequency at room temperature, and $\Delta f$ is a frequency difference from the frequency f at room temperature.

The oscillator output circuit 2 includes an oscillating stage 2a serving as an oscillator circuit and a buffering stage 2b having a buffer amplifier or the like. The oscillating stage 2a is formed as a Colpitts type circuit having a voltage dividing capacitor (not shown) and transistor (not shown) for oscillation, that form a resonance circuit along with the crystal unit 1. Here, the oscillating stage 2a is formed as a voltage control type circuit having a voltage-controlled capacitative element 4Cv in an oscillatory loop, for example. In the drawing, Vcc is a power source, Vout is an output, and Vc is a control voltage.

In the temperature control circuit 3, a temperature sensing voltage Vt by a temperature sensing element (for example, thermistor) 4th and a resistor 4R1 is applied to one input terminal of an operational amplifier 40A, and a reference voltage Vr by resistors 4R2 and 4R3 is applied to the other input terminal. Then, a differential voltage between the reference voltage Vr and the temperature sensing voltage Vt is applied to the base of a power transistor 4Tr, and electric power from the power source Vcc is supplied to the chip resistors (hereinafter called heating resistors 4h) 4h serving as heating elements. Thereby, the electric power to the heating resistors 4h is controlled with a temperature-dependent resistance value of the temperature sensing element 4th, to keep the operational temperature of the crystal unit 1 constant. An operational temperature is to be approximately 80° C. which is a minimum value or a maximum value at room temperature or more, for example (see FIG. 8).

The circuit substrate 5 is made of, for example, glass epoxy as a base material, and a circuit pattern (not shown) is formed thereon, and the respective circuit elements 4 including the crystal unit 1 are installed on both principal surfaces thereof (see FIG. 6A). In this example, the crystal unit 1, and the heating resistors 4h, the power transistor 4Tr, and the temperature sensing element 4th in the temperature control circuit are installed on the bottom face of the circuit substrate 5. The crystal unit 1 is installed on the central area, and the heating resistors 4h, the power transistor 4Tr, and the temperature sensing element 4th are installed on the outer circumference thereof. However, here, the voltage-controlled capacitative element 4Cv which is temperature-dependent to greatly vary its characteristic, is installed on the outer circumference of the crystal unit 1. These crystal unit 1 and circuit elements 4 are covered with heat conducting resin 13.

Then, the other circuit elements 4 of the oscillator output circuit 2 and the temperature control circuit are installed on the top face of the circuit substrate 5. In this case, for example, a capacitor for adjusting oscillating frequency and the like are installed on the top face of the circuit substrate 5, which makes it easy to adjust oscillating frequency. Then, in particular, the respective circuit elements 4 of the oscillating stage 2a having an affect on an oscillating frequency are disposed on the top face of the circuit substrate 5 facing the area covered with the heat conducting resin 13.

However, in the constant-temperature type oscillator having the above-described configuration, the heating resistors 4h and the power transistor 4Tr are thermally coupled particularly to the crystal unit 1 with the heat conducting resin 13, meanwhile, the heat conductivity of the heat conducting resin 13 is less than or equal to 1/100 of that of metal such as, for example, gold (Au) or copper (Cu) of an electrically-conducting path as a circuit pattern, which results in the problem that the efficiency of heat conduction thereof is inferior to that of a crystal unit. Meanwhile, the heat conductivity of the heat conducting resin 13, for example, KE-3467 is 2.4, and those of Au and Cu serving as an electrically-conducting path are respectively 319 and 403.

SUMMARY OF THE INVENTION

An object of the invention is to provide a constant-temperature type oscillator in which a crystal unit is formed into a surface mounting type, and heating resistors and a power transistor serve as a heat source, which enhances the efficiency of heat conduction.

The invention has been achieved by focusing attention on the technology of JP-A-2006-311496 by the present applicant, i.e., as shown in FIG. 8, the configuration in which a circuit terminal for dummy 14b to which the dummy terminals 12b of the crystal unit 1 are firmly fixed, is connected to an electrically-conducting path 15 to which one end of the thermistor 4th is connected, to directly detect an operational temperature of the crystal unit 1. Incidentally, reference numerals 14a in the drawing are circuit terminals to which the crystal terminals 12a are connected. Then, the invention has been achieved by conceiving of the point that the dummy terminals 12b of the crystal unit 1 are connected to the electrically-conducting path to which the heating resistors are connected, which enhances the efficiency of heat conduction from the heating resistors to the crystal unit.

According to a first aspect of the invention, there is provided a constant-temperature type crystal oscillator comprising: a crystal unit for surface mounting comprising: case main body, which has at least a bottom wall, and in which two crystal terminals and two dummy terminals serving as mounting terminals are provided on an outer bottom face thereof; and a crystal element that is housed in the case main body to be hermetically encapsulated with a cover; an oscillator output circuit comprising an oscillating stage formed along with the crystal unit and a buffering stage; a temperature control circuit that keeps an operational temperature of the crystal unit constant; and a circuit substrate, on which circuit elements of the crystal unit, the oscillator output circuit and the temperature control circuit are installed, wherein the temperature control circuit comprises: heating chip resistors; a power transistor that supplies electric power to the chip resistors; and a temperature sensing element that detects an operational temperature of the crystal unit, wherein each of the dummy terminals of the crystal unit is connected to a respective one of circuit terminals on the circuit substrate, and wherein at least one of the circuit terminals is connected to an electrically-conducting path, to which one terminal of the heating chip resistors is electrically connected, on the circuit substrate.

According to a second aspect of the invention, in the constant-temperature type crystal oscillator, wherein the one terminal of the heating chip resistors is electrically connected to a collector of the power transistor via the electrically-conducting path on the circuit substrate.

According to a third aspect of the invention, in the constant-temperature type crystal oscillator, wherein the circuit terminal for dummy is provided to extend on the circuit substrate so as to face entirely a central area of a bottom face of the crystal unit.

According to a fourth aspect of the invention, in the constant-temperature type crystal oscillator, wherein at least the crystal unit, the heating chip resistors, the power transistor, and the temperature sensing element are installed on one principal surface of the circuit substrate, to be covered with heat conducting resin, and wherein the other circuit elements are installed on the other principal surface of the circuit substrate.

According to a fifth aspect of the invention, in the constant-temperature type crystal oscillator, wherein the cover of the crystal unit is a metal cover, wherein the crystal unit is disposed such that both principal surface of the crystal element, on which excitation electrodes are formed, face the bottom wall of the case main body and the metal cover, and wherein the dummy terminals provided on the outer bottom face of the case main body are electrically connected to the metal cover via an electrically-conducting path in the case main body.

According to a sixth aspect of the invention, in the constant-temperature type crystal oscillator, wherein a plurality of the heating chip resistors are installed so as to surround an outer circumference of the crystal unit, and wherein Joule heat generated from the plurality of chip resistors is set to be uniform.

According to a seventh aspect of the invention, in the constant-temperature type crystal oscillator, wherein a plurality of the heating chip resistors are connected in parallel, one end of the parallel connection being connected to, not only the collector of the power transistor, but also the dummy terminals, and the other end of the parallel connection being connected to a power source.

According to an eighth aspect of the invention, in the constant-temperature type crystal oscillator, wherein the crystal unit is disposed such that the principal surface of the crystal element, on which the excitation electrode is formed, faces the bottom wall of the case main body, and wherein the dummy terminals provided on the bottom face of the case main body are provided to extend on a central area of the bottom wall of the case main body.

According to a ninth aspect of the invention, in the constant-temperature type crystal oscillator, wherein at least four corners of the circuit substrate is held by lead wires of a base that forms an oscillator case, and wherein the metal cover is bonded to the base so as to cover the circuit substrate.

According to the aspects of the invention, the dummy terminals of the crystal unit are connected to one terminal of the chip resisters (heating resistors) via the electrically-conducting path of the circuit substrate. Accordingly, heat from the heating resistors is conducted to the dummy terminals of the crystal unit via the electrically-conducting path, to be directly supplied to the crystal unit. Thereby, the heating resistors and the crystal unit are strongly thermally coupled to one another, and thus efficiency of heat conduction to the crystal unit can be enhanced.

According to the second aspect of the invention, heat from, not only the heating resistors, but also the power transistor is directly supplied to the crystal unit via the electrically-conducting path. Therefore, the efficiency of heat conduction can be further enhanced.

According to the third aspect of the invention, heat from the heating resistors is radiated entirely to the bottom face of the crystal unit by the dummy terminals extended in the central area. Therefore, the efficiency of heat conduction can be further enhanced.

According to the fourth aspect of the invention, heat from the heating resistors and the power transistor is conducted uniformly to the crystal unit via the heat conducting resin, which makes uniform a temperature distribution of the crystal unit, and stabilizes a detected temperature by the temperature sensing element. Accordingly, temperature control of the crystal unit is made easy. Further, since other circuit elements other than those are installed on the other principal surface of the circuit substrate, these circuit elements are also stabilized in its operational temperature.

According to the fifth aspect of the invention, heat from the heating resistors is conducted to the metal cover via the electrically-conducting path, and the heat is further radiated from the metal cover to the principal surface of the crystal element. Accordingly, the principal surface of the crystal element is entirely heated up. Therefore, the efficiency of heat conduction can be enhanced.

According to the sixth aspect of the invention, the crystal unit is further heated up uniformly, and thus the temperature distribution can be uniformed.

According to the seventh aspect of the invention, the plurality of heating resistors is connected to the dummy terminals, to heat up those. Therefore, it is possible to further enhance the efficiency of heat conduction as compared with the case of serial connection.

According to the eighth aspect of the invention, the principal surface of the crystal unit is entirely heated up by the dummy terminals provided on entirely the bottom wall. Therefore, the efficiency of heat conduction can be enhanced. In this case, when the configuration of the fourth aspect is further added to the configuration of the eight aspect, it is possible to further enhance the efficiency of heat conduction.

According to the ninth aspect of the invention, it is possible to implement the final configuration of the constant-temperature type oscillator.

BRIEF DESCRIPTION OF THE DRAWINGS

FIGS. 6A and 6B are diagrams of a related art constant-temperature type oscillator, in which FIG. 6A is a cross-sectional view of the related art constant-temperature type oscillator, and FIG. 6B is a circuit diagram of the related art constant-temperature type oscillator;

FIGS. 7A to 7C are diagrams of a crystal unit of the related art constant-temperature type oscillator, in which FIG. 7A is a cross-sectional view of the related art constant-temperature type oscillator, FIG. 7B is a bottom view of the crystal unit, and FIG. 7C is a frequency-temperature characteristic diagram of the crystal unit.

DETAILED DESCRIPTION OF THE PREFERRED EMBODIMENTS

Figure 1:
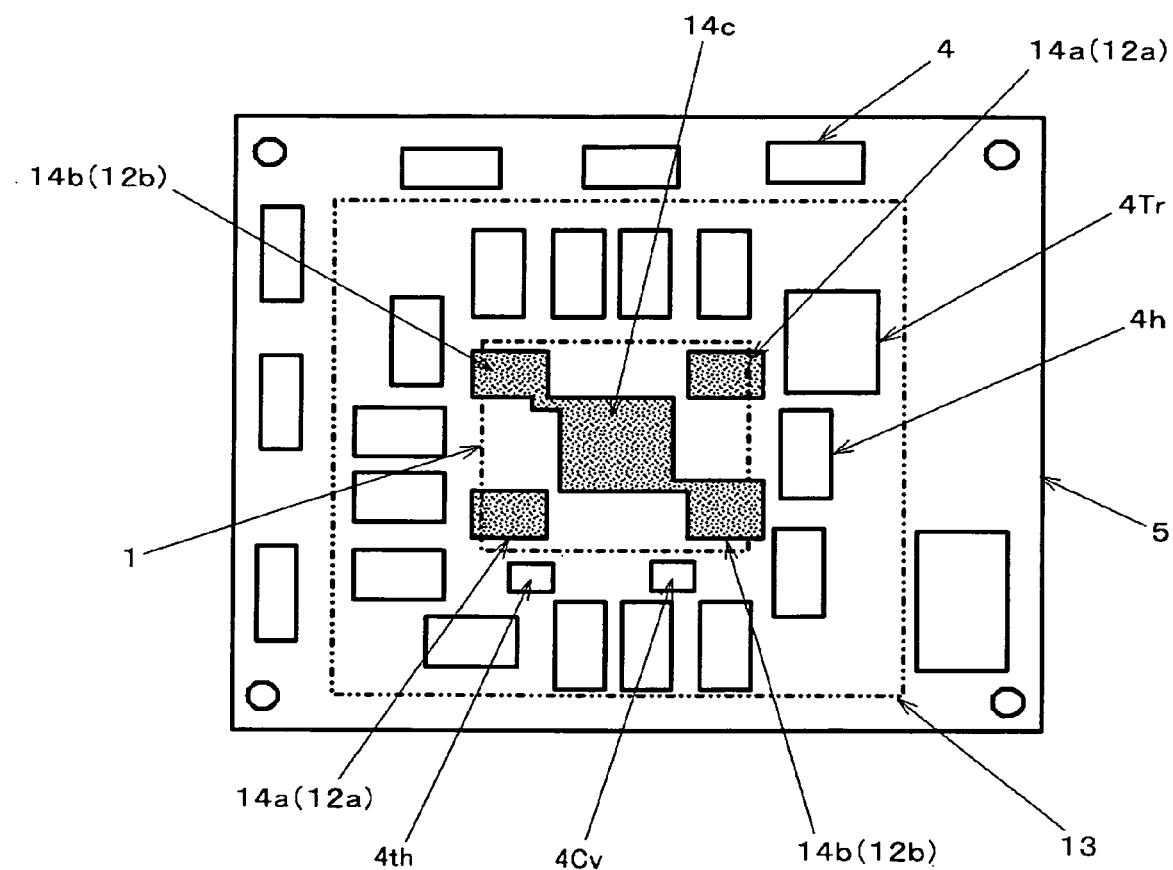
FIG. 1 is a bottom view of a circuit substrate of a constant-temperature type oscillator according to one embodiment of the invention.

FIG. 1 is a bottom view of a circuit substrate of a constant-temperature type oscillator according to one embodiment of the invention. Incidentally, portions which are the same as those in the related example are denoted by the same symbols, and descriptions thereof will be simplified or omitted.

Figure 6A:
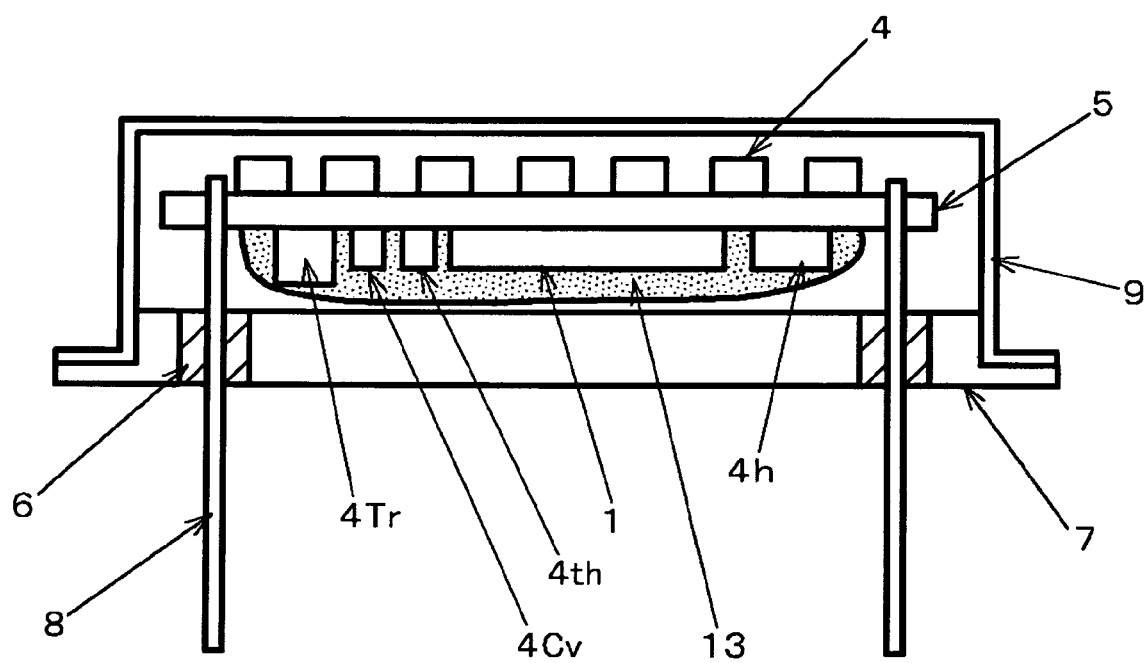
Figure 6B:
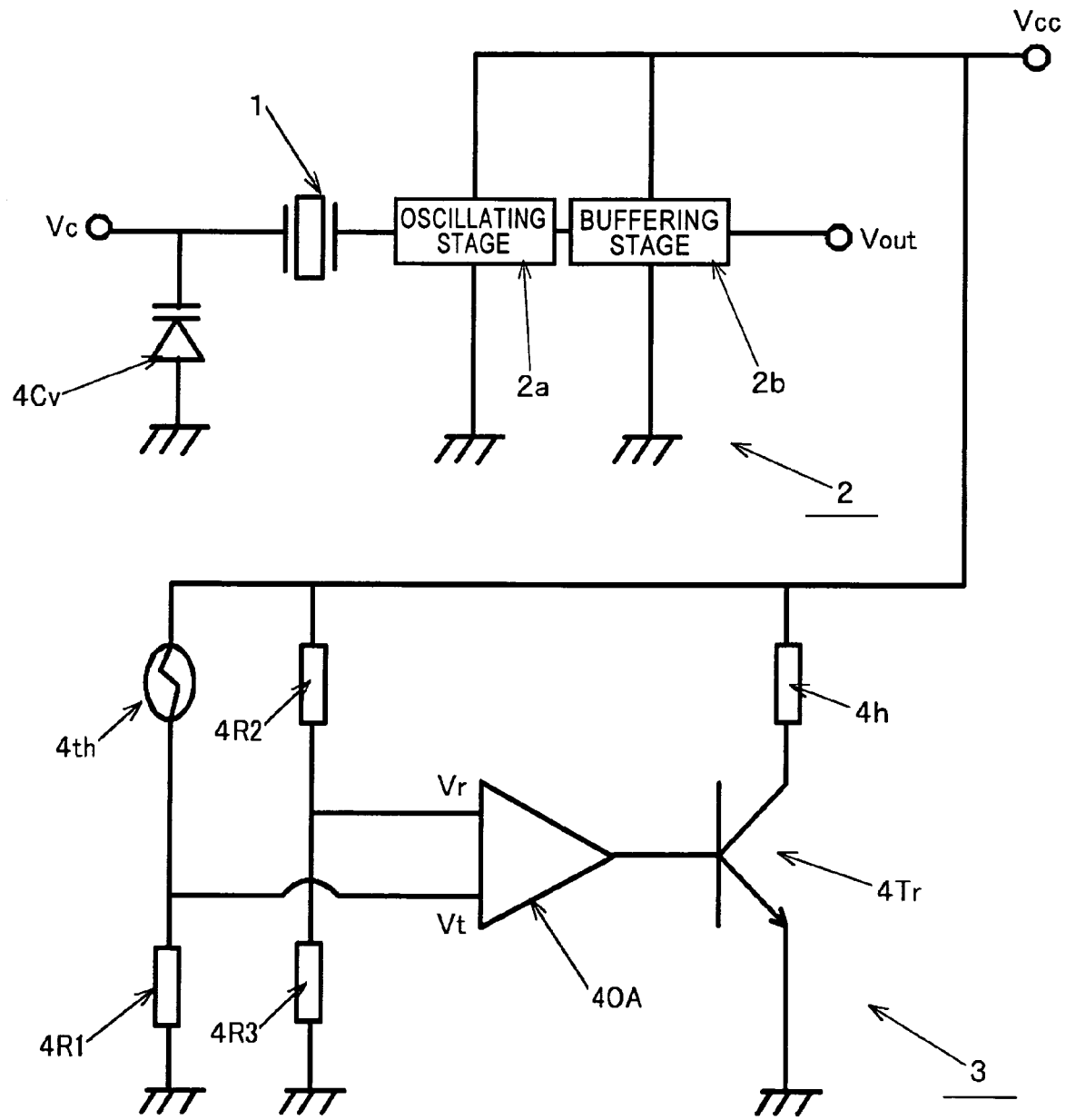

As described above, the constant-temperature type oscillator according to the invention is configured such that the circuit substrate 5 in which the crystal unit 1 formed for surface mounting and the respective circuit elements 4 of the oscillator output circuit 2 and the temperature control circuit 3 are installed on both principal surfaces of the circuit substrate 5, is housed in the oscillator case 6 (see FIG. 6A). Incidentally, the temperature control circuit 3 functions as a temperature compensation circuit of the crystal unit 1. The outer circumferential portion of the circuit substrate 5 is held by the lead wires (airtight terminals) 8 of the metal base 7 of the oscillator case 6, to be electrically and mechanically connected. The circuit substrate 5 is made of a glass epoxy material with a wiring pattern (electrically-conducting path) made of copper foil.

The crystal unit 1, the heating resistors 4h, the power transistor 4Tr, the temperature sensing element 4th, and further the highly temperature-dependent voltage-controlled capacitative element 4Cv in the temperature control circuit 3 are installed on the bottom face (one principal surface) of the circuit substrate 5. Then, these circuit elements 4 including the crystal unit 1 are covered with the heat conducting resin 13. The other circuit elements 4 including an adjuster element are installed on the top face (the other principal surface) of the circuit substrate 5.

Figure 7A:
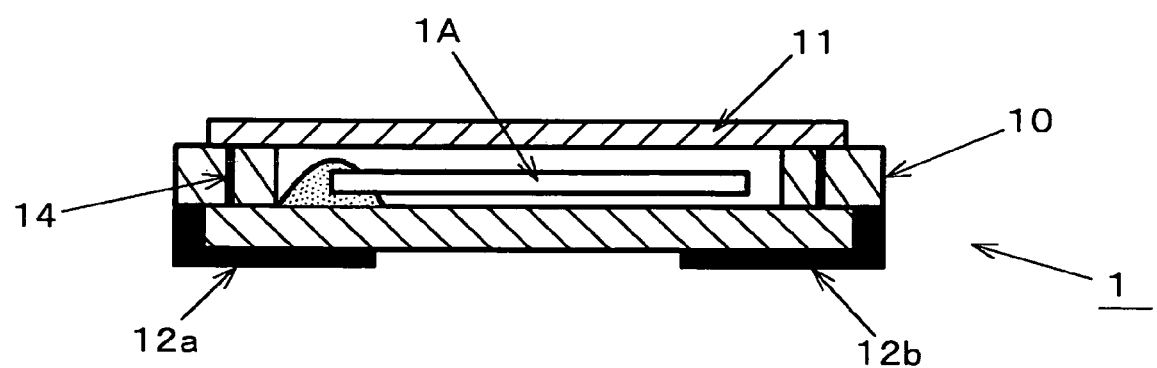
Figure 7B:
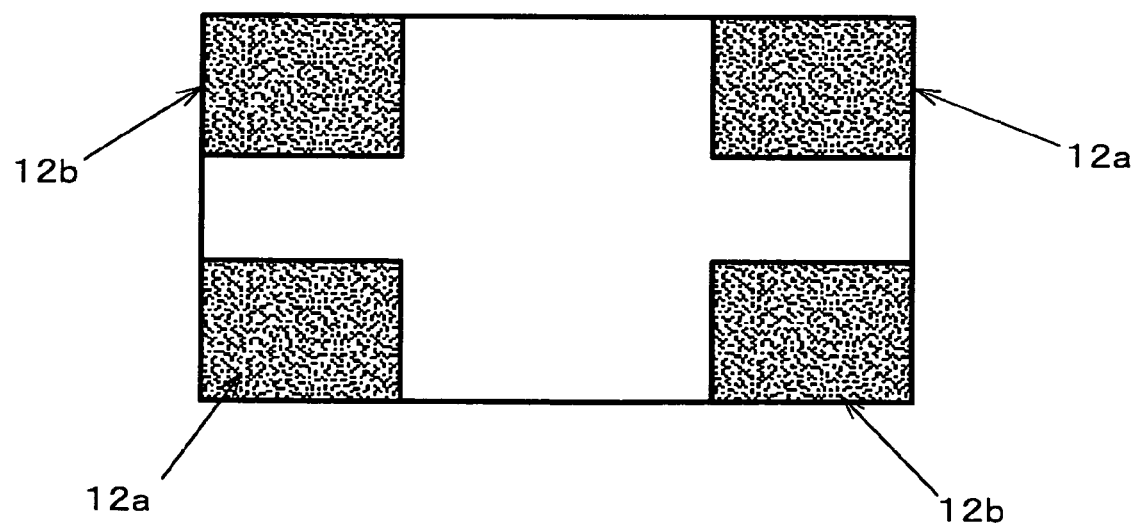
Figure 7C:
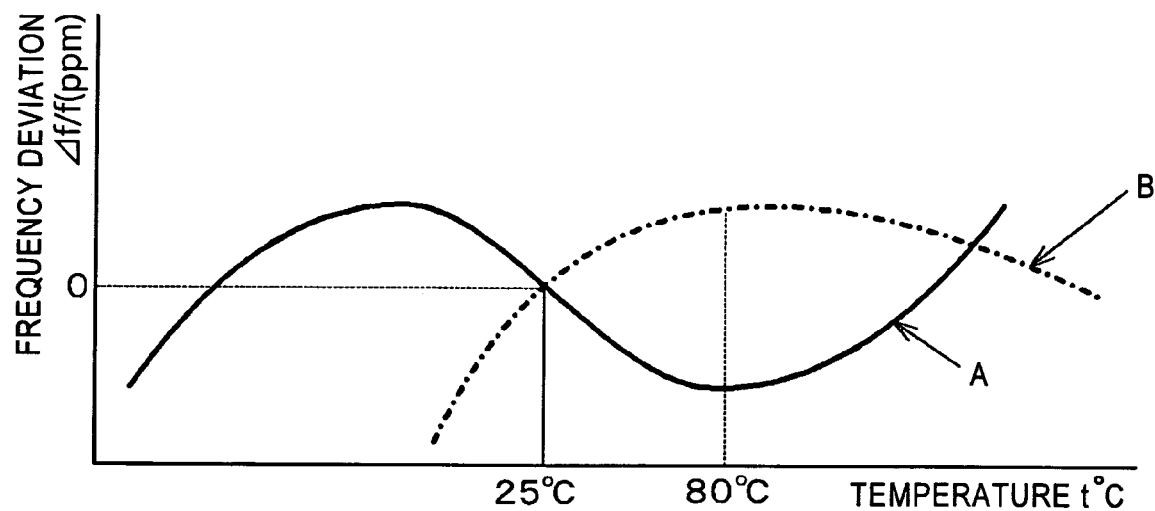
Figure 8:
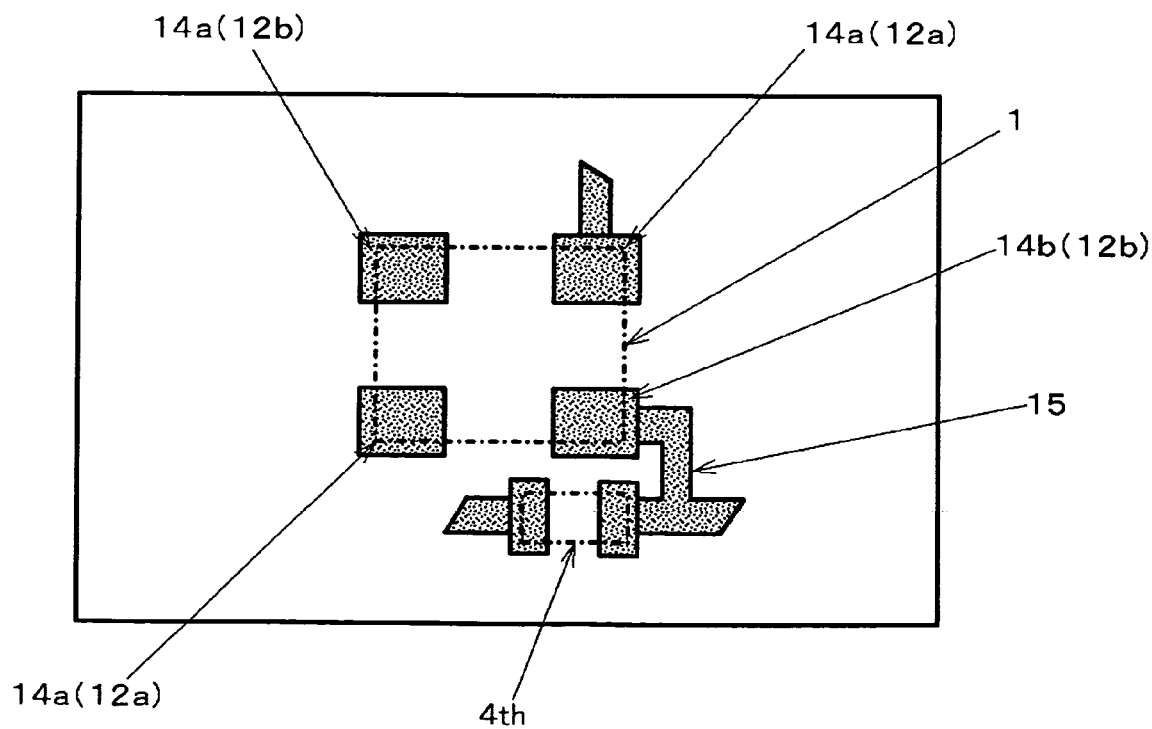
FIG. 8 is a bottom view of a circuit substrate according to the related art constant-temperature type oscillator.

The crystal unit 1 includes a pair of the crystal terminals 12a and a pair of the dummy terminals 12b on the outer bottom face of the case main body 10 which is formed to be concave (see FIGS. 7A and 7B). The crystal terminals 12a on a set of corners are electrically connected to the crystal element 1A, and the dummy terminals 12b on the other set of corners are electrically connected to the metal cover 11 via the electrically-conducting path including the through electrodes 14.

Figure 2:
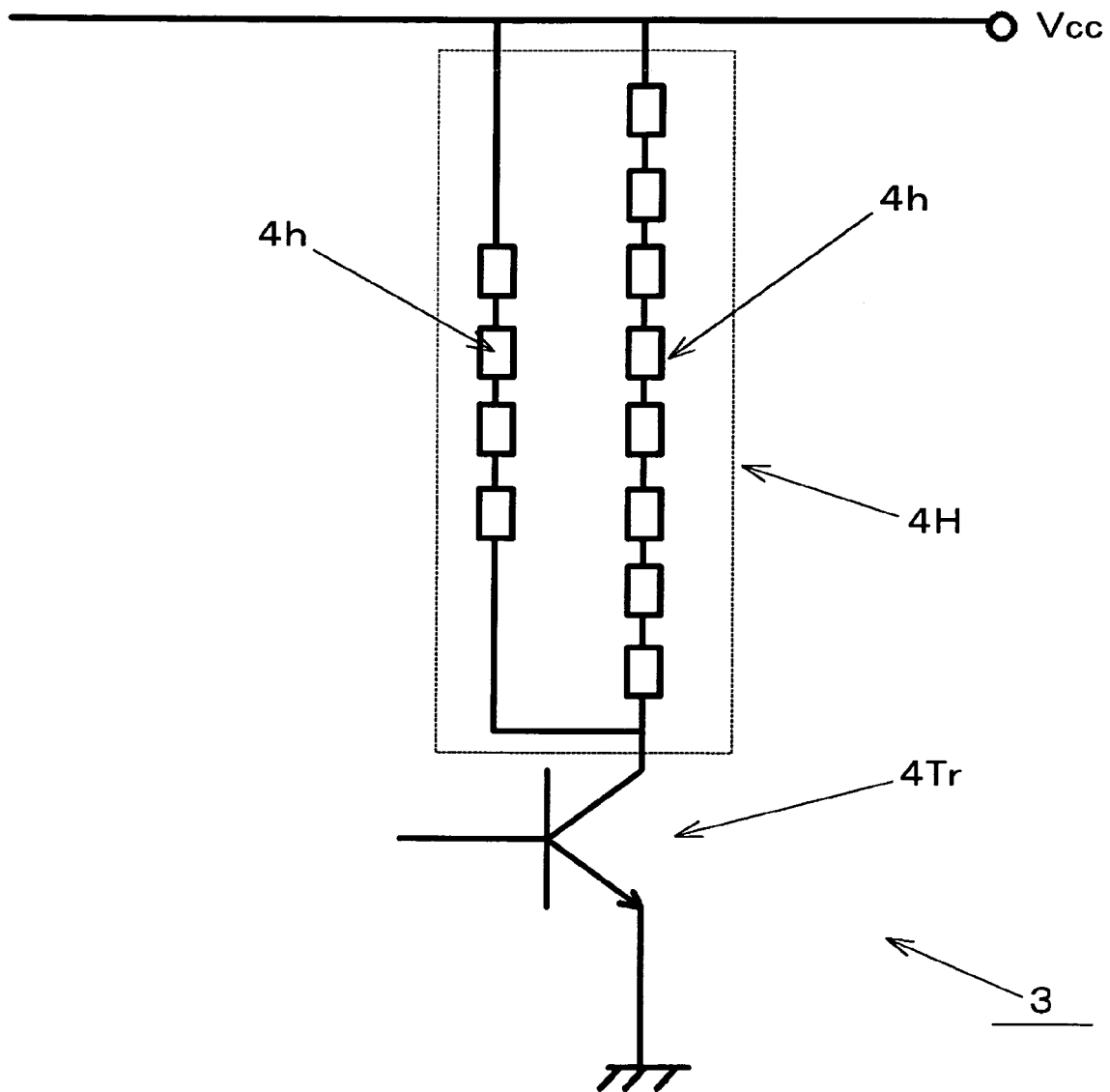
FIG. 2 is a partial schematic view of a temperature control circuit of the constant-temperature type oscillator.

Then, in this embodiment, a plurality of, for example, twelve heating resistors 4h are installed so as to surround the outer circumference of the crystal unit 1. Here, the single power transistor 4Tr is installed, for example, on the outer circumference of a corner of the crystal unit 1, so as to surround the crystal unit 1 along with the heating resistors 4h (see FIG. 1). The (twelve) heating resistors 4h are, as shown in a partial circuit schematic view of FIG. 2, connected such that four heating resistors 4h in the first series connection and eight heating resistors 4h in the second series connection are in parallel with each other. One end of the parallel connection of the four and eight heating resistors 4h, i.e., one end of a heating resistor group 4H shown by the dotted frame is connected to the collector of the power transistor 4Tr, and the other end of the heating resistor group 4H is connected to the power source Vcc.

In this case, the resistance values are different between the heating resistors 4h in the first series connection and the heating resistors 4h in the second series connection, and the resistance values of the heating resistors 4h in the first series connection and the heating resistors 4h in the second series connection are respectively the same. Thereby, uniform Joule heat is generated in the twelve respective heating resistors 4h on the basis of rating and the like of the power transistor 4Tr. Incidentally, the four heating resistors 4h in the first series connection are larger in outer shape than the eight heating resistors 4h in the second series connection. This is because of the disposition and the like of the heating resistors 4h onto the circuit substrate 5.

Figure 3:
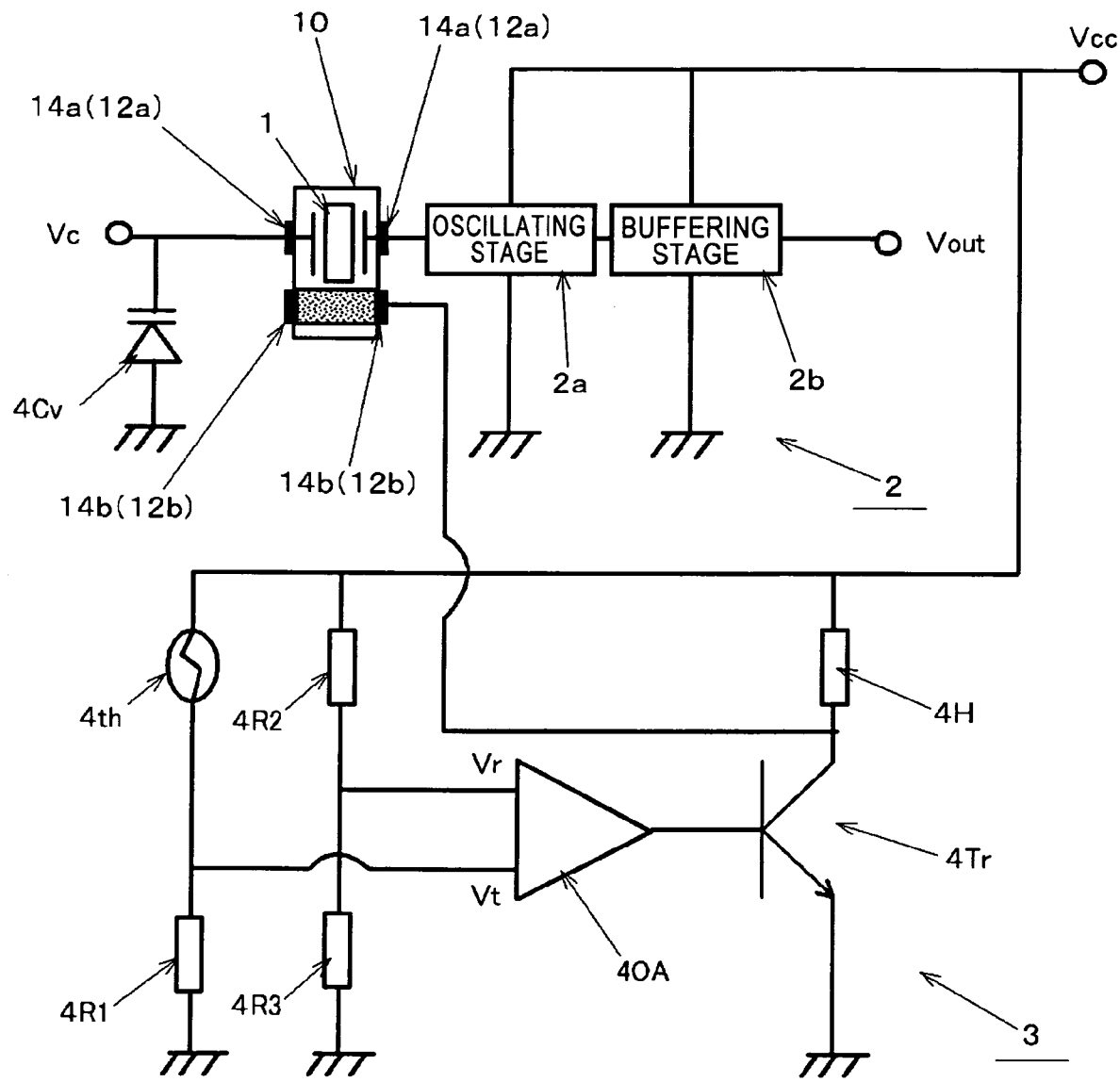
FIG. 3 is a circuit diagram of the constant-temperature type oscillator.

Then, here, a electrically-conducting path (not shown) on the circuit substrate 5 to connect the one end of the heating resistor group 4H and the power transistor 4Tr is connected so as to be firmly fixed to the circuit terminal for dummy 14b to which the one of the dummy terminals 12b on the other set of diagonal corners of the crystal unit 1 is connected, with a solder or the like. Then, the circuit terminal for dummy 14b is provided to extend on the circuit substrate 5 so as to face entirely the central area of the bottom face of the crystal unit 1, and both are electrically connected to one another. Incidentally, the relationship of this wire connection is shown in FIG. 3. However, the encircled frame of the crystal unit 1 in FIG. 3 is a schematic bottom view of the case main body 10. The crystal terminals 12a of the crystal unit 1 are connected to the circuit terminals 14a.

According to such a configuration, the electrically-conducting path (Cu) connecting the heating resistors 4h and the power transistor 4Tr is connected to the circuit terminal for dummy 14b for the crystal unit 1. That is, the circuit terminal for dummy 14b is connected to the electrically-conducting path, to which one terminal of the heating resistor group 4H (heating resistors 4h) is electrically connected. Thereby, heat from the heating resistors 4h and the power transistor 4Tr is conducted to the circuit terminal for dummy 14b via the electrically-conducting path. Then, the heat is supplied to the bottom face of the case main body 10 made of laminar ceramic via the dummy terminals 12b of the crystal unit 1. Accordingly, specifically heat from the heating resistors 4h serving as a main heat source is directly supplied to the case main body 10 of the crystal unit 1 via the electrically-conducting path excellent in heat conduction property, which enhances the efficiency of heat conduction.

Then, in this example, the circuit terminal for dummy 14b is formed to extend on the circuit substrate 5 which is the central area of the bottom face of the crystal unit 1, and faces entirely the bottom face of the crystal unit 1. Further, the dummy terminals 12b of the crystal unit connected to the circuit terminal for dummy 14b are electrically connected to be thermally coupled to the metal cover 11 of the crystal unit 1 via the electrically-conducting path such as through electrodes and the like. Accordingly, because heat is efficiently conducted to the circuit terminal for dummy 14b on the central area of the bottom face and the metal cover 11 on the top face, a so-called heat tube is formed. Thereby, further enhancing the efficiency of heat conduction.

Moreover, these heating resistors 4h and power transistor 4Tr serving as a heat source, the crystal unit and the temperature sensing element 4th are covered with the heat conducting resin 13, and, for example, a heat distribution is uniformed. Accordingly, real-time temperature control is made easy. Further, because the heating resistors 4h are connected in parallel as the first and second series connections, it is possible to increase heat supplied to the circuit terminal for dummy 14b as compared with the case in which all the heating resistors 4h are series-connected.

Modified Examples

Figure 4:
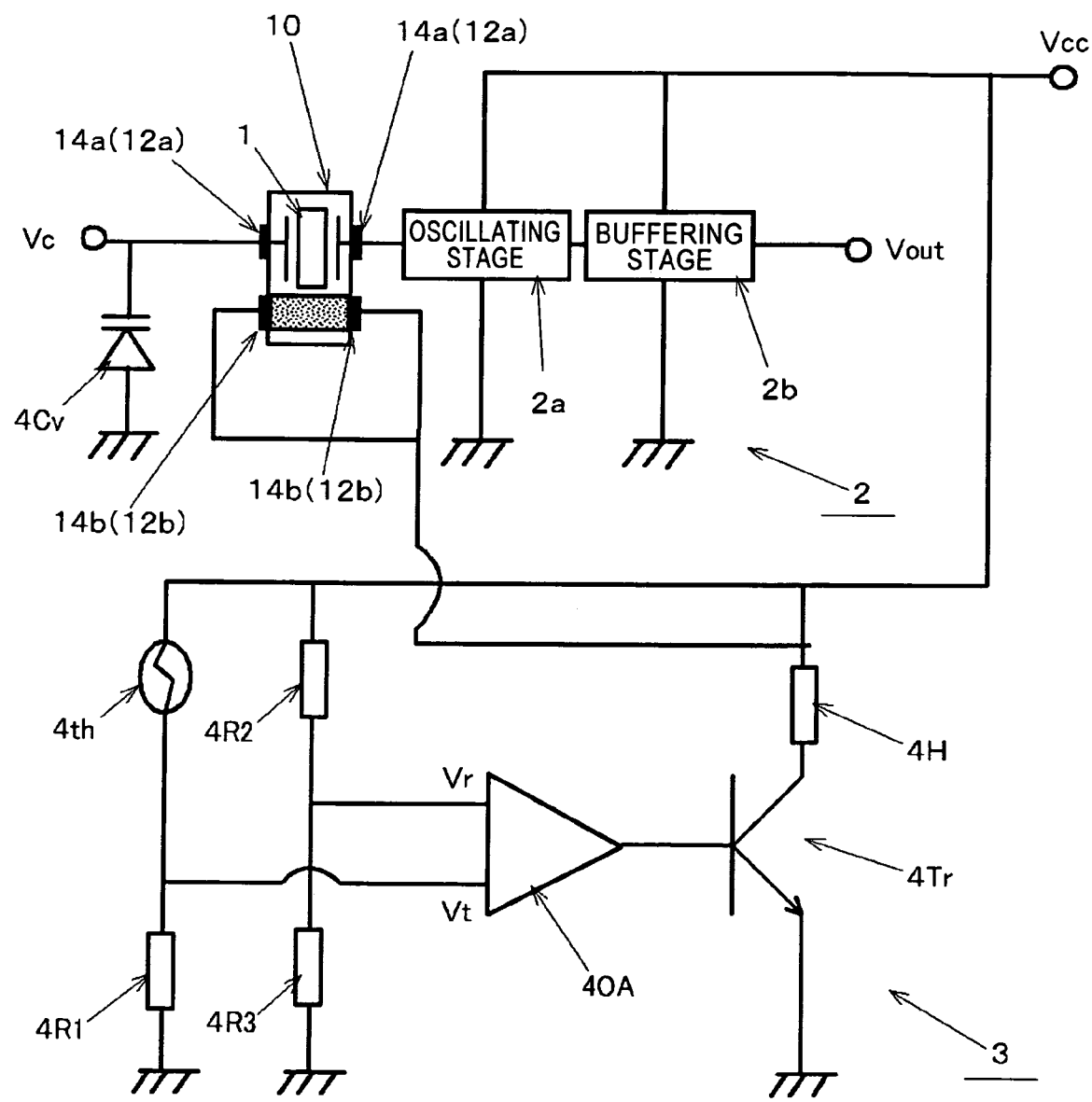
FIG. 4 is a circuit diagram of a constant-temperature type crystal oscillator according to another embodiment of the invention.

In the above-described embodiment, the circuit terminal for dummy 14b is connected between the heating resistor group 4H and the power transistor 4Tr. However, for example, as shown in FIG. 4, the circuit terminal for dummy 14b may be connected between the heating resistor group 4H and the power source. That is, it suffices for the circuit terminal for dummy 14b to be connected to any one terminal of the heating resistor group 4H (heating resistor 4h).

Figure 5:
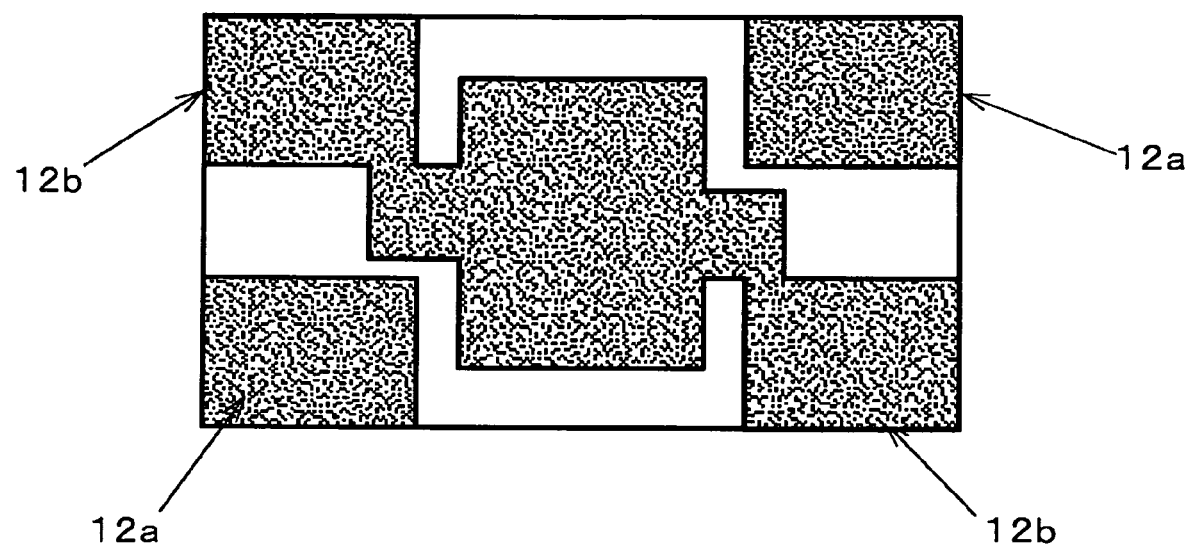
FIG. 5 is a bottom view of a crystal unit of a constant-temperature type crystal oscillator according to yet another embodiment of the invention.

Further, in the crystal unit 1, the dummy terminals 12b are provided on the other set of diagonal corners. However, in the same way as the circuit terminal for dummy 14b described above, the dummy terminals 12b may be provided to extend on the central area of the bottom face of the crystal unit 1 (the case main body 10) (see FIG. 5). In this case, the central area may be, not only the outer bottom face, but also the inner bottom face or the lamination plane of the case main body 10. Then, in these cases, it is possible to further come close to being a heat tube.

Further, the power transistor 4Tr is arrayed on the outer circumference of the crystal unit 1 along with the heating resistors 4h. However, the power transistor 4Tr may be arrayed at the outer side of the heating resistors 4h. In this case, for example, it is possible to eliminate nonuniformity in temperature distribution due to a difference in heat quantities of the power transistor 4Tr and the respective heating resistors 4h. Incidentally, by disposing the power transistor 4Tr at the outer side of the heat conducting resin to be excluded from the heat source, the uniformity of temperature distribution is further improved. However, because energy as a heat source is wasted, this mode is selected as needed.

Further, the heating resistors 4h are twelve, and are connected in parallel as the first and second series connections. However, for example, the twelve heating resistors 4h may be connected in parallel. In this case, it is possible to further increase heat supplied to the circuit terminal for dummy 14b. Then, the number of heating resistors 4h is not limited to twelve, and may be selected randomly. Further, the number of power transistor 4Tr is set to one. However, for example, the oscillator may be formed such that the number of power transistors 4Tr is the same as that of the heating resistors 4h.

What is claimed is:

1. A constant-temperature type crystal oscillator comprising:
    a crystal unit for surface mounting comprising:
        a case main body, which has at least a bottom wall, and in which two crystal terminals and two dummy terminals serving as mounting terminals are provided on an outer bottom face thereof; and
        a crystal element that is housed in the case main body to be hermetically encapsulated with a cover;
    an oscillator output circuit comprising an oscillating stage formed along with the crystal unit and a buffering stage;
    a temperature control circuit that keeps an operational temperature of the crystal unit constant; and
    a circuit substrate, on which circuit elements of the crystal unit, the oscillator output circuit and the temperature control circuit are installed,
    wherein the temperature control circuit comprises:
        heating chip resistors;
        a power transistor that supplies electric power to the chip resistors; and
        a temperature sensing element that detects an operational temperature of the crystal unit,
    wherein each of the dummy terminals of the crystal unit is connected to a respective one of circuit terminals on the circuit substrate, and
    wherein at least one of the circuit terminals is connected to an electrically-conducting path, to which one terminal of the heating chip resistors is electrically connected, on the circuit substrate.

2. The constant-temperature type crystal oscillator according to claim 1, wherein the one terminal of the heating chip resistors is electrically connected to a collector of the power transistor via the electrically-conducting path on the circuit substrate.

3. The constant-temperature type crystal oscillator according to claim 1,
wherein each of the circuit terminals is provided to extend on the circuit substrate so as to face entirely a central area of a bottom face of the crystal unit.

4. The constant-temperature type crystal oscillator according to claim 1,
wherein at least the crystal unit, the heating chip resistors, the power transistor, and the temperature sensing element are installed on one principal surface of the circuit substrate, to be covered with heat conducting resin, and
wherein the other circuit elements are installed on the other principal surface of the circuit substrate.

5. The constant-temperature type crystal oscillator according to claim 1,
wherein the cover of the crystal unit is a metal cover,
wherein the crystal unit is disposed such that both principal surface of the crystal element, on which excitation electrodes are formed, face the bottom wall of the case main body and the metal cover, and
wherein the dummy terminals provided on the outer bottom face of the case main body are electrically connected to the metal cover via an electrically-conducting path in the case main body.

6. The constant-temperature type crystal oscillator according to claim 1,
wherein a plurality of the heating chip resistors are installed so as to surround an outer circumference of the crystal unit, and
wherein Joule heat generated from the plurality of chip resistors is set to be uniform.

7. The constant-temperature type crystal oscillator according to claim 1,
wherein a plurality of the heating chip resistors are connected in parallel, one end of the parallel connection being connected to, not only the collector of the power transistor, but also the dummy terminals, and the other end of the parallel connection being connected to a power source.

8. The constant-temperature type crystal oscillator according to claim 1,
wherein the crystal unit is disposed such that the principal surface of the crystal element, on which the excitation electrode is formed, faces the bottom wall of the case main body, and
wherein the dummy terminals provided on the bottom face of the case main body are provided to extend on a central area of the bottom wall of the case main body.

9. The constant-temperature type crystal oscillator according to claim 1,
wherein at least four corners of the circuit substrate is held by lead wires of a base that forms an oscillator case, and
wherein the metal cover is bonded to the base so as to cover the circuit substrate.

10. The constant-temperature type crystal oscillator according to claim 1, wherein said at least one of the circuit terminals is directly electrically connected to the one terminal of the heating chip resistor.

11. The constant-temperature type crystal oscillator according to claim 1, wherein the electrically-conducting path conducts heat from the chip resistors to the crystal unit.

* * * * *